US010177429B1

(12) United States Patent
Tsironis

(10) Patent No.: US 10,177,429 B1
(45) Date of Patent: Jan. 8, 2019

(54) HYBRID HARMONIC IMPEDANCE TUNER

(71) Applicant: Christos Tsironis, Dollard-des-Ormeaux (CA)

(72) Inventor: Christos Tsironis, Kirkland (CA)

( * ) Notice: Subject to any disclaimer, the term of this patent is extended or adjusted under 35 U.S.C. 154(b) by 20 days.

(21) Appl. No.: 15/628,770

(22) Filed: Jun. 21, 2017

Related U.S. Application Data

(60) Provisional application No. 62/353,124, filed on Jun. 22, 2016.

(51) Int. Cl.
| | |
|---|---|
| *H03H 7/38* | (2006.01) |
| *H01P 5/04* | (2006.01) |
| *G01R 27/32* | (2006.01) |
| *G01R 31/28* | (2006.01) |
| *H03H 7/40* | (2006.01) |
| *G01R 31/26* | (2014.01) |
| *H03J 1/14* | (2006.01) |

(52) U.S. Cl.
CPC .............. *H01P 5/04* (2013.01); *G01R 27/32* (2013.01); *G01R 31/2822* (2013.01); *H03H 7/38* (2013.01); *H03H 7/40* (2013.01); *G01R 31/2614* (2013.01); *H03J 1/14* (2013.01)

(58) Field of Classification Search
CPC .................................. H03H 7/38; H03H 7/40
USPC ....................................................... 333/263
See application file for complete search history.

(56) References Cited

U.S. PATENT DOCUMENTS

| | | |
|---|---|---|
| 6,674,293 B1 | 1/2004 | Tsironis |
| 7,282,926 B1 | 6/2007 | Verspecht et al. |
| 9,331,670 B1 | 5/2016 | Mahmoudi et al. |
| 9,960,472 B1 * | 5/2018 | Tsironis ................. H01P 5/04 |

OTHER PUBLICATIONS

"A New Load-pull Characterization Method for Microwave Power Transistors," Y. Takayama, [online], 1976 IEEE Microwave Theory & Techniques Society (MTT-S) International Microwave Symposium, pp. 218-220. [Retrieved on Apr. 6, 2017]. Retrieved from Internet <URL: http:ieeexplore.ieee.org/document/1123701/>.
"Active Load Pull System, ALPS", Product Note 33, Focus Microwaves, 1966, p. 3, Figure 3.
"Computer-Aided Error Correction of Large-Signal Load-Pull Measurements", Tucker, R.S. and BR Adley P., [online], IEEE Transactions on Microwave Theory and Techniques, vol. MTT-32, No. 3, Mar. 1984, pp. 296-300. [Retrieved Apr. 6, 2017]. Retrieved from Internet < URL: http:ieeexplore.ieee.org/document/1132668/>.

(Continued)

*Primary Examiner* — Stephen E. Jones

(57) ABSTRACT

A hybrid harmonic slide screw tuner uses the forward injection technique, also called Gamma Boosting Unit (GBU) cascaded with two independent tuning probes in the same slabline and housing. The wave-probes used in the GBU sample a portion of the forward travelling signal, adjusts its phase, amplifies it, adjusts its amplitude (attenuation) and couples it back, in reverse direction into the main signal path. In the present active tuner technique as is herein implemented, the passive tuners and the signal couplers are mounted on the same double carriages which move each carriage horizontally and the wave- and tuning probes vertically, independently. Appropriate calibration and tuning algorithms ensure independent hybrid (active and passive) harmonic tuning.

6 Claims, 15 Drawing Sheets

(56) References Cited

OTHER PUBLICATIONS

4. "Comparison of Active Versus Passive On-wafer Load-pull Characterization of Microwave and Millimeter-wave Power Devices," J. E. Muller and B. Gyselinckx, [online],1994 IEEE MTT-S Digest, CH3389-4/94/0000-1007$01.00, pp. 1007-1080, Figure 1, [Retrieved Apr. 6, 2017]. Retrieved from Internet < URL: http://ieeexplore.ieee.org/el5/1100/7886/00335168.pdf>.
6. "MPT, a Universal Multi-Purpose Tuner" Product Note 79, Focus Microwaves Inc., Oct. 2004.
"High resolution tuners eliminate load pull performance errors", Application Note 15, Focus Microwaves, Jan. 1995, pp. 6 and 7.

* cited by examiner

FIG. 7 (see FIG. 3)

HYBRID HARMONIC IMPEDANCE TUNER

PRIORITY CLAIM

This application claims priority on provisional application 62/353,124, filed on Jun. 22, 2016, titled "Hybrid Harmonic Impedance Tuner".

CROSS-REFERENCE TO RELATED ARTICLES

1. "A New Load-pull Characterization Method for Microwave Power Transistors," Y. Takayama, [online], 1976 IEEE Microwave Theory & Techniques Society (MTT-S) International Microwave Symposium, pp. 218-220. [Retrieved on 2017 Apr. 6]. Retrieved from Internet <URL:http://ieeexplore.ieee.org/document/1123701/>.
2. "Active Load Pull System, ALPS", Product Note 33, Focus Microwaves, 1966, page 3, FIG. 3.
3. "Computer-Aided Error Correction of Large-Signal Load-Pull Measurements", TUCKER, R. S. and BRADLEY P., [online], IEEE Transactions on Microwave Theory and Techniques, vol. MTT-32, No. 3, March 1984, pp. 296-300. [Retrieved 2017-April 06]. Retrieved from Internet <URL: http://ieeexplore.ieee.org/document/1132668/>.
4. "Comparison of Active Versus Passive On-wafer Load-pull Characterization of Microwave and Millimeter-wave Power Devices," J. E. Muller and B. Gyselinckx, [online], 1994 IEEE MTT-S Digest, CH3389-4/94/0000-1007$01.00, pp 1007-1080, FIG. 1, [Retrieved 2017-April 06]. Retrieved from Internet <URL: http://ieeexplore.ieee.org/iel5/1100/7886/00335168.pdf>.
5. Mahmoudi, et al. U.S. Pat. No. 9,331,670, "Gamma Boosting Unit (GBU) for Hybrid Load and Source Pull".
6. "MPT, a Universal Multi-Purpose Tuner" Product Note 79, Focus Microwaves Inc., October 2004.
7. "High resolution tuners eliminate load pull performance errors", Application Note 15, Focus Microwaves, January 1995, pages 6 and 7.
8. Verspecht, et al., U.S. Pat. No. 7,282,926, "Method and an apparatus for characterizing a high-frequency device-under-test in a large signal impedance tuning environment".
9. Tsironis, C., U.S. Pat. No. 6,674,293, "Adaptable Pre-matched Tuner System and Method".

BACKGROUND OF THE INVENTION

This invention relates to high power (nonlinear) testing of microwave transistors (DUT). When the transistor is driven in its nonlinear operation regime, whereby they create also harmonic signal components and the internal output impedance of power transistors is very low. An impedance tuner used to match the transistor must also match such impedance. Passive impedance tuners can reach maximum reflection factors Γ.tuner of the order of 0.95, corresponding to impedances of 2.4 Ohm. The insertion loss between DUT and tuner reduces the available tuning range at the DUT reference plane and thus the capacity of the passive tuner to match the transistor. The only remedy to this limitation is using active systems, i.e. test systems whereby a signal coherent with the signal injected into the transistor, is injected independently into the DUT output terminal and creates a virtual load. This additional signal can be the only one injected, in which case we speak of "active" load pull, or is can be superimposed to signal reflected by a passive tuner, in which case we speak of "hybrid" load pull; obviously if only a mechanical tuner is present, we speak of "passive" load pull. In both active and hybrid injection cases the objective is to reach and match the internal impedance of the transistor; in general terms a standard requirement is a dynamic tuning range reaching a reflection factor $|\Gamma|=1$ (corresponding to the real part of an internal impedance of 0 Ohm). The objective of this invention is a hybrid (active and passive) tuner apparatus, combining a forward signal injection mechanism within a passive tuner architecture allowing $|\Gamma|=1$ at two harmonic frequencies (see ref. 6 and 9).

DESCRIPTION OF PRIOR ART

There have been several attempts to active load pull systems, starting back in the 70'ies (see ref. 1 to 4). Such load pull techniques use exclusively the so called "virtual load" method. The virtual load method consists in injecting into the output of the DUT RF power at the same frequency as traversing the DUT from the input to the output, but with controlled phase and amplitude. Knowing that the reflection factor "seen" by the DUT is equal to the ratio of returned (reflected) power wave <a> to primary output power wave <b>: (Γ=<a>/<b>), it is understood that by controlling the phase and amplitude of <a> we can control Γ. There are a number of ways to do this: One is to use an "active load" technique (see ref. 2). In this case part of the outgoing power Pout is split into a directional coupler, filtered, phase adjusted, amplified and re-injected into the output port of the DUT, which will "see" a complex load Γ as described above. Another method is to use splitting the input signal (see ref. 1) or using two synchronized RF sources (see ref. 3) one to inject RF power into the input of the DUT and one into its output. Since the sources are synchronized they can generate a coherent signal and if we adjust the relative phases between sources and the amplitude of the second source, then the DUT will, again, see at its output port a "virtual" load Γ, as described earlier.

BRIEF DESCRIPTION OF THE INVENTION

The concept used in this invention to create the active part of the load is the forward injection technique, also called Gamma Boosting Unit (GBU), FIG. 1, see ref. 5. The GBU samples a portion of the reflected signal at the LP tuner (port 2 in FIG. 1), adjusts its phase using a phase shifter (<Φ>), amplifies it, adjusts its amplitude (attenuation (τ)) and couples it back (port 1 in FIG. 1), in reverse direction into the main signal path. Both signals, the reflected one at the LP tuner and the injected one add up to create the hybrid (active+passive) load. The new way this concept is implemented in this invention, though, eliminates the need for both the individual phase shifter (1) and the attenuator (τ); this creates a better, simpler and more effective solution and allows integrating with an impedance tuner in the same slabline with minimum transition loss. The passive part of the hybrid tuner uses conventional capacitively coupled tuning probes (FIG. 4). Using two independent reflective probes in the slabline and combining the passive reflection vectors, creates user defined impedances at two or more harmonic frequencies independently and the active injection of the amplified signal boosts the magnitude of the associated reflection factors up to 1 (real part of the Impedance=0 Ohms), FIGS. 6 and 13.

BRIEF DESCRIPTION OF THE SEVERAL VIEWS OF THE DRAWINGS

The invention and its mode of operation will be more clearly understood from the following detailed description when read with the appended drawings in which:

FIG. 11A depicts the case where carriage 1 being closer to the test port; FIG. 11B depicts the case of carriage 2 being closer to the test port.

DETAILED DESCRIPTION OF THE INVENTION

Figure 5:
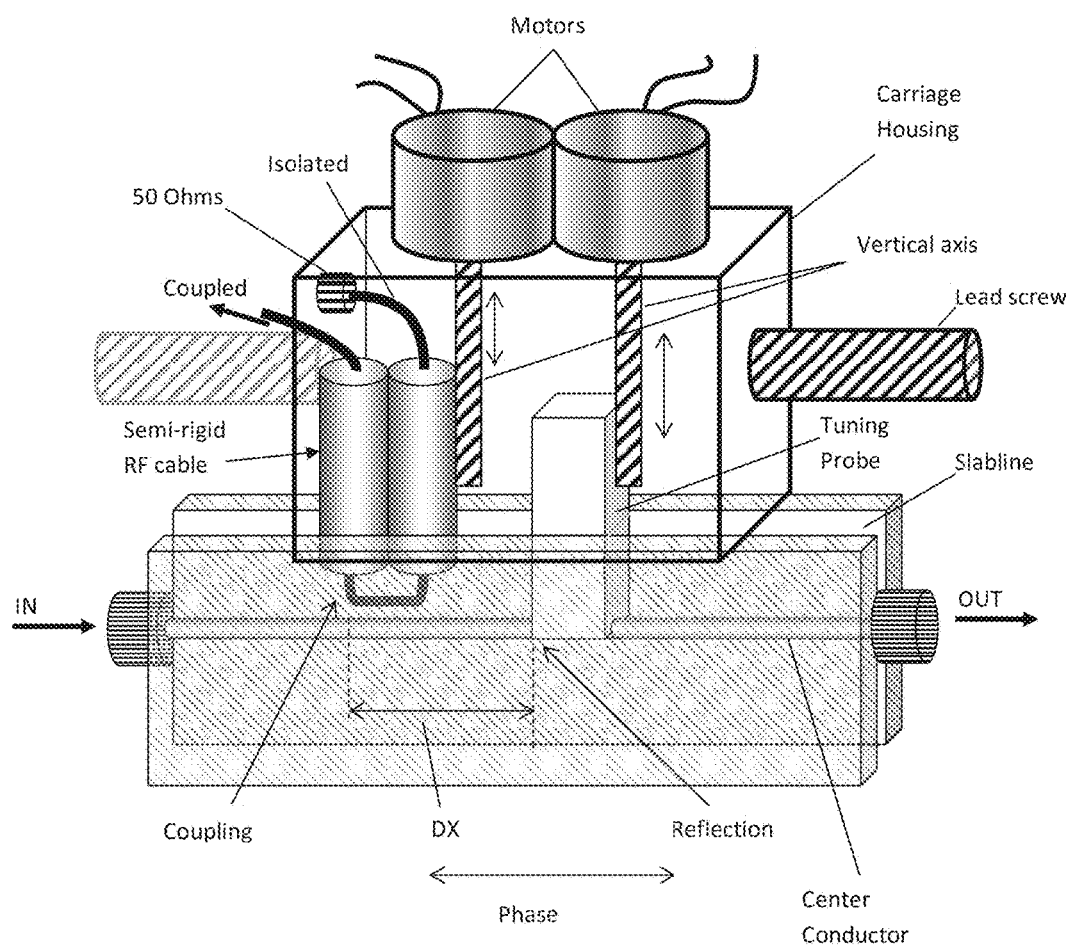
FIG. 5 depicts a view of a mobile carriage of the hybrid harmonic tuner comprising a wave-probe and a tuning probe, each attached on vertical axis individually controlled by stepper motors.
Figure 13:
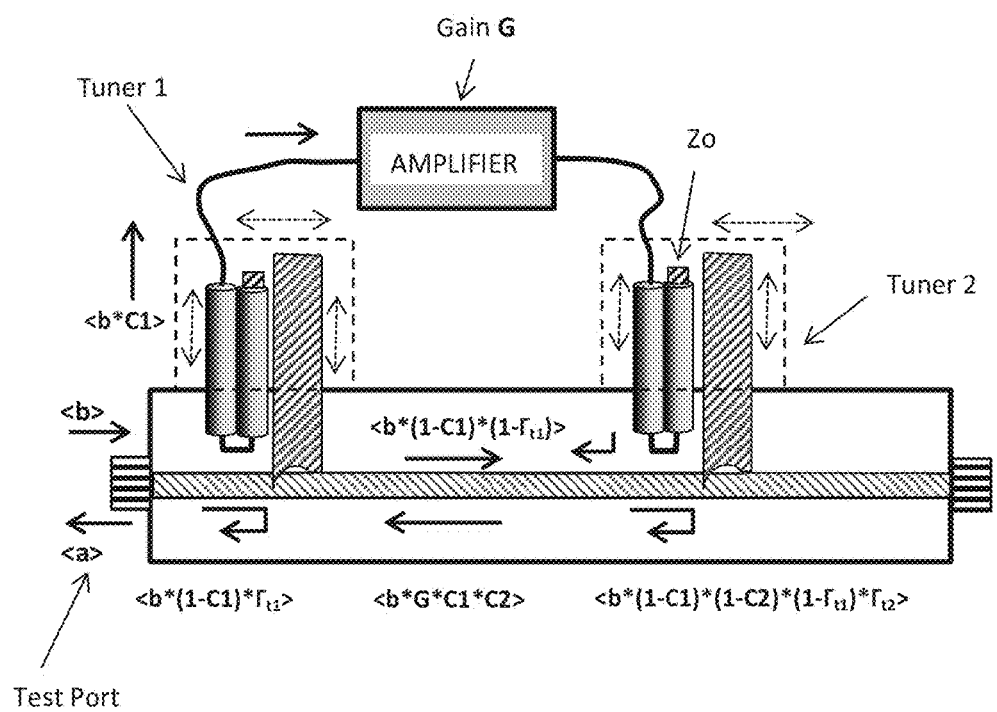
FIG. 13 depicts the basic signal travelling wave flow in the hybrid harmonic tuner.

The concept of the Hybrid (active-passive) Harmonic slide screw Tuner (HHT) is shown in FIGS. 5, 6, 9 and 10 in two different embodiments. The concept of the individual tuning element is shown in FIG. 5. It comprises a mobile carriage with two independent motorized vertical axes. On one axis there is a wave-probe attached and on the second axis a reflective, capacitive tuning probe. The carriage is drivel along the slabline using a lead screw, belt or rack-and-pinion drive. In a first embodiment, FIG. 6, the mobile carriages (66), (67) are mounted on the same side of the slabline (top only) and moved using one lead screw—acme rod (69) each one wavelength along the slabline (65). Whereas the passive tuner (64), which operates in reflection requires only one half of a wavelength to cover 360 degrees on the Smith chart ($\Phi.passive=-4\pi*L/\lambda$), whereby L is the horizontal travel distance of the carriage, the active part through the wave probes (61), the amplifier (62) and back (63) operates in transmission and requires a full wavelength to cover 360 degrees ($\Phi.active=-2\pi*L/\lambda$). In both cases the signal coupled into the first wave-probe (61) and re-injected through wave-probe (63) overlaps with the main signal into the test port (60) and reflected at the tuning probes (64) and (68). A more comprehensive representation of signal flows is shown in FIG. 13.

Details of the mobile carriages used in the hybrid tuner are shown in FIG. 5. Each carriage has a housing that comprises two remotely controlled stepper motors, which control the vertical movement of a precision vertical axis each. Attached to one axis is a wave-probe (see FIG. 2 and ref. 8) and to the second axis a wideband tuning probe (see FIG. 4). In order to be able to control (tune) at two harmonic frequencies (Fo and 2Fo or 3Fo) the wave-probes and tuning probes used must respond appropriately to all used frequencies, i.e. the tuning probes must be able to create high reflection (typically up to $|\Gamma|=0.8$) and the wave-probes to couple signals with coupling factors up to 10 dB and higher (see FIGS. 7 and 8). The fact that the coupling factor of wave-probes increases with frequency is favorable: it improves the sensitivity of the system at harmonic frequencies. By moving the wave probe vertically one controls the coupling between the center conductor of the slabline and the coupled wire of the wave-probe, while the isolated wire of the wave-probe is terminated with 50 Ohms (see FIG. 3). The vertical movement of the tuning probe controls the reflection and consequently the reflection factor $\Gamma$ (see also FIG. 13).

Figure 15:
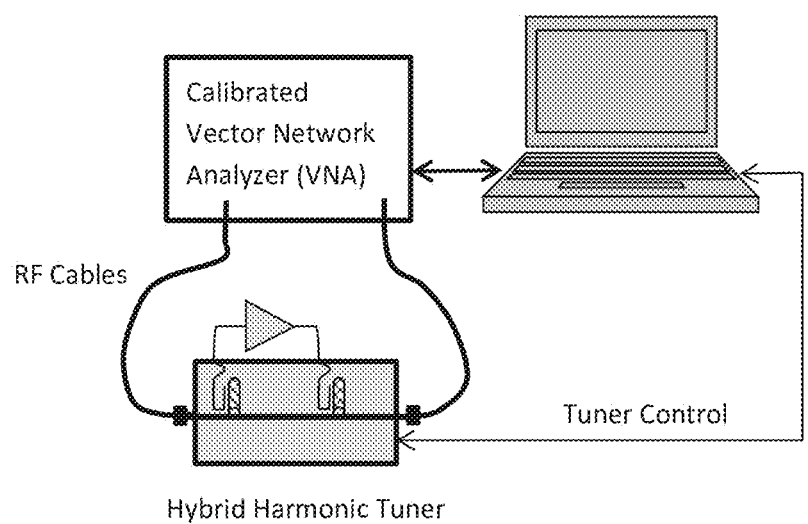
FIG. 15 depicts calibration setup of hybrid harmonic tuner.

Moving the whole carriage horizontally along the slabline controls the phase of the reflection factor seen at the input port (IN). The proximity of the wire of the wave-probe magnetic loop (Coupling) to the center conductor also creates reflection, but a lesser one. In any case its effect is accounted for in the calibration procedure. The combination of two carriages as described in FIG. 5 ((66) and (67) in FIG. 6) and the external amplifier (62), inserted between the coupled ports of the first and second wave-probes forms the hybrid harmonic tuner (HHT) able to control the reflection factor at the test port (60) at two harmonic frequencies with reflection factor values equal or higher than 1. Reflection factors higher than 1 are often needed in order to compensate the insertion loss between the DUT and the tuner (see FIG. 12). Each carriage moves horizontally independently along the slabline (65) driven by acme lead screw gear (69) and each vertical axis moves independently either the wave-probes (61), (63) and/or the tuning probes (64), (68): the unit has 6 independently controlled axes, controlled via stepper motor each, using electronic control board and a control PC which runs appropriate software (see FIG. 15). The PC also controls and reads data from the vector network analyzer (VNA).

Figure 1:
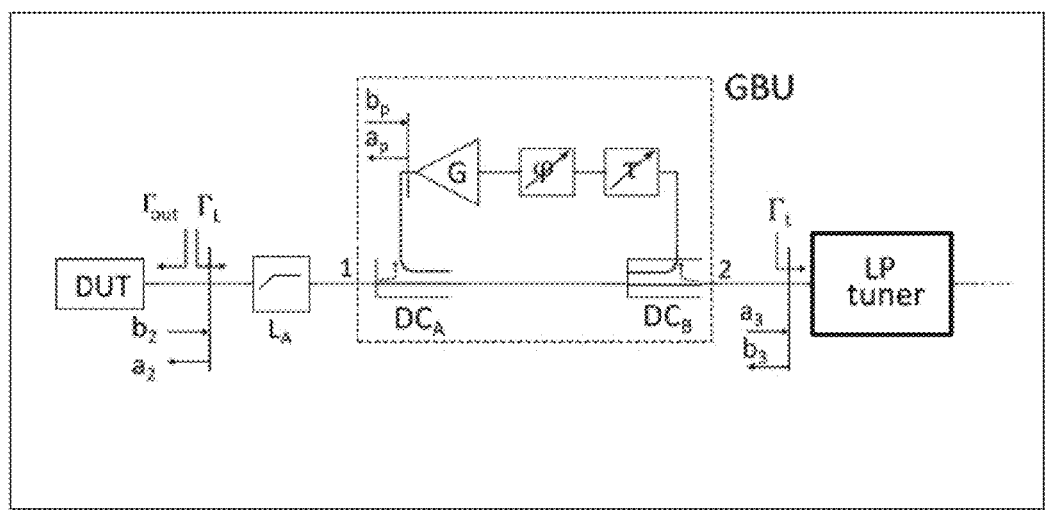
FIG. 1 depicts prior art, the Gamma Boosting Unit, a forward coupling active injection system, (see ref. 1)
Figure 2:
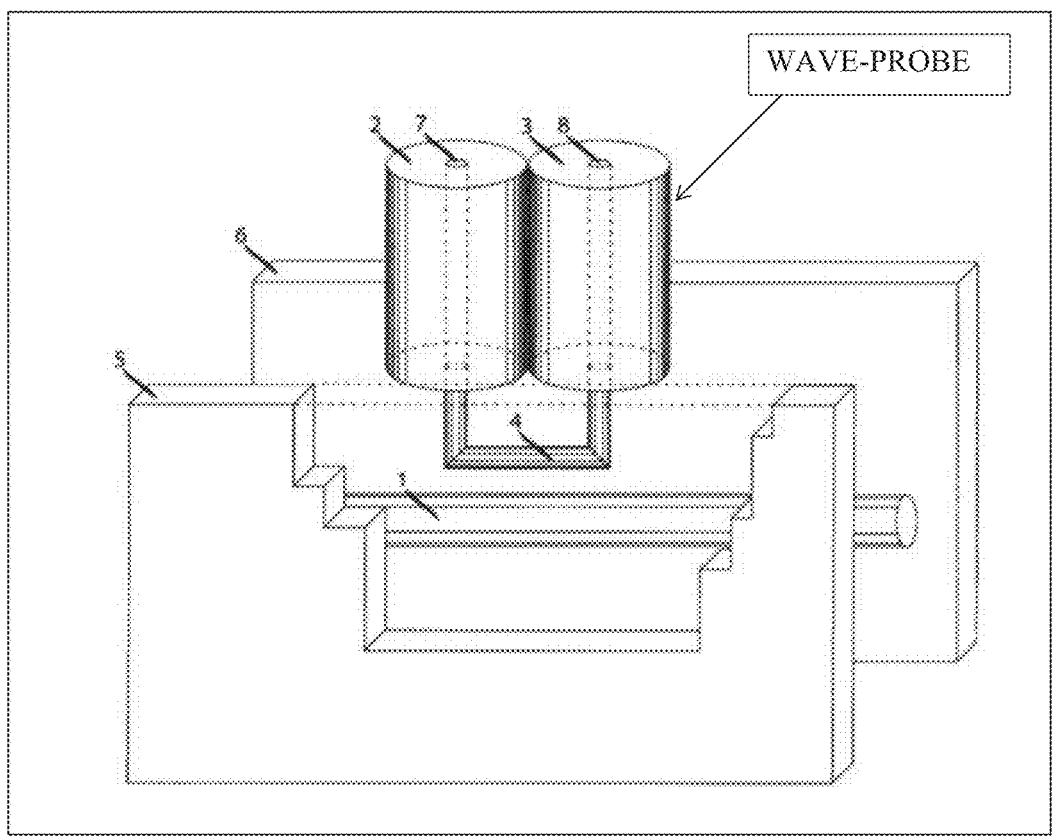
FIG. 2 depicts prior art, a compact signal coupler using a folded semi-rigid coaxial cable, ("wave-probe").
Figure 3:
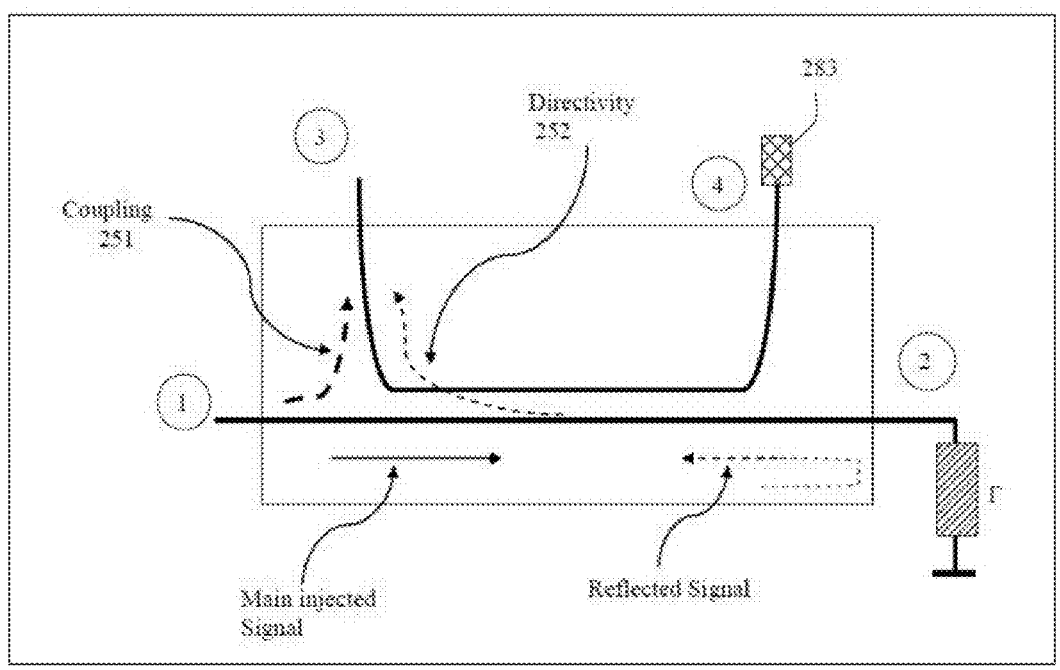
FIG. 3 depicts prior art, signal flow definitions in a directional coupler, (see ref. 3).
Figure 4:
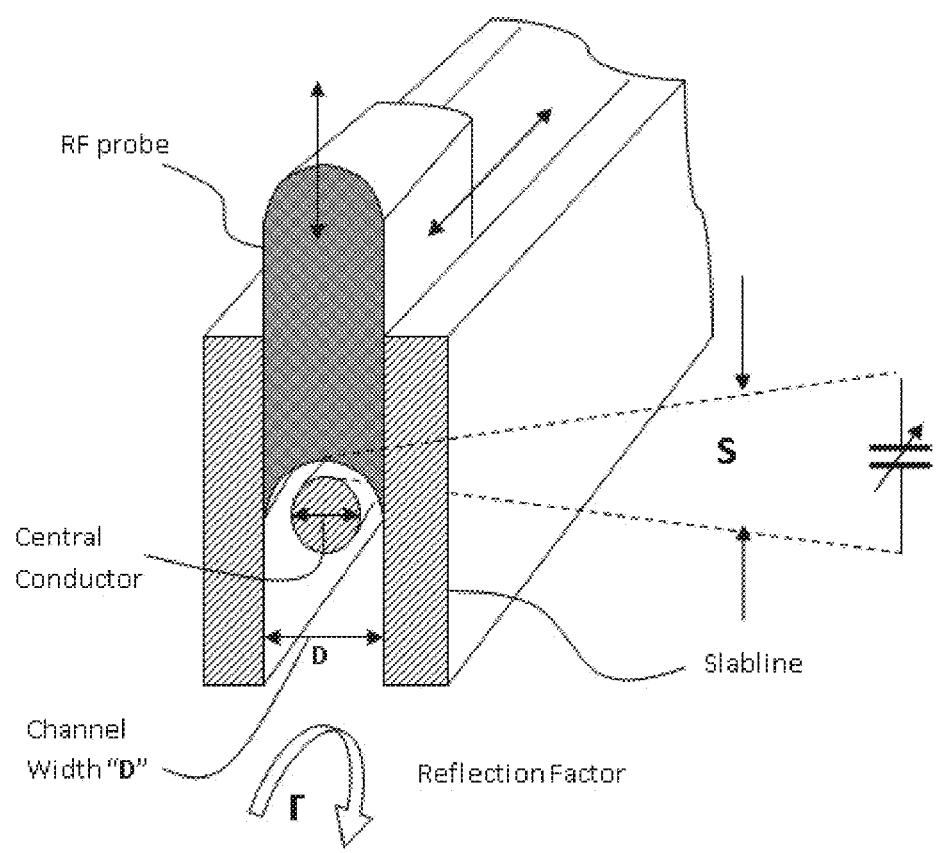
FIG. 4 depicts prior art, a slabline section and a capacitively coupled tuning (reflective) probe inserted into the slot of the slabline.

FIG. 3 depicts forward and reverse (directivity or isolation) coupling of a short signal coupler as in FIG. 2 (known also as "wave-probe"). The measured difference of over 10 dB for a simple uncompensated structure (FIG. 7) shows the usefulness of the application. The coupling factor itself is adjustable (FIG. 8), by setting the distance between center conductor (1) and coupler (4), FIG. 2, through vertical movement of the vertical axis (FIG. 5). This allows adjusting the attenuation of the amplifier loop (61), (62), (63).

The signal coupled into the wave-probes is moving only forward. Therefore its phase follows the relation: $\Phi=-2\pi*L/\lambda$; this means, in order to cover 360 degrees one has to move the carriage by a full wavelength λ, (L=λ gives Φ=−2π). For low frequencies <1.5 GHz this means the tuners must be large (λ(1.5 GHz)=22.5 cm), each carriage are at least 5 cm wide and, including supporting hardware (5 cm) the minimum size of a tuner operating at 1.5 GHz is at 45+10+5=60 cm. This can be reduced to approximately 22.5+10=33 cm, if the tuner is configured as shown in a second embodiment, whereby the slabline is used twice ("double slabline"), by mounting the carriages (132) and the motors (130) on top and bottom of the slabline (133) and inserting the axes (131) and the tuning and wave probes (here the magnetic loop of the wave-probe is visible from the side as a pin (136)) from opposite directions (see FIGS. 9 to 11). The tuning probes do not interfere mechanically since none really extends beyond the center of the center conductor (137) of the slabline (133) (FIG. 9) even when they are placed closest to the center conductor (137). The coupled signal (134) is fed into the input of the amplifier and returns into the other wave-probe from the output of the amplifier.

Figure 10:
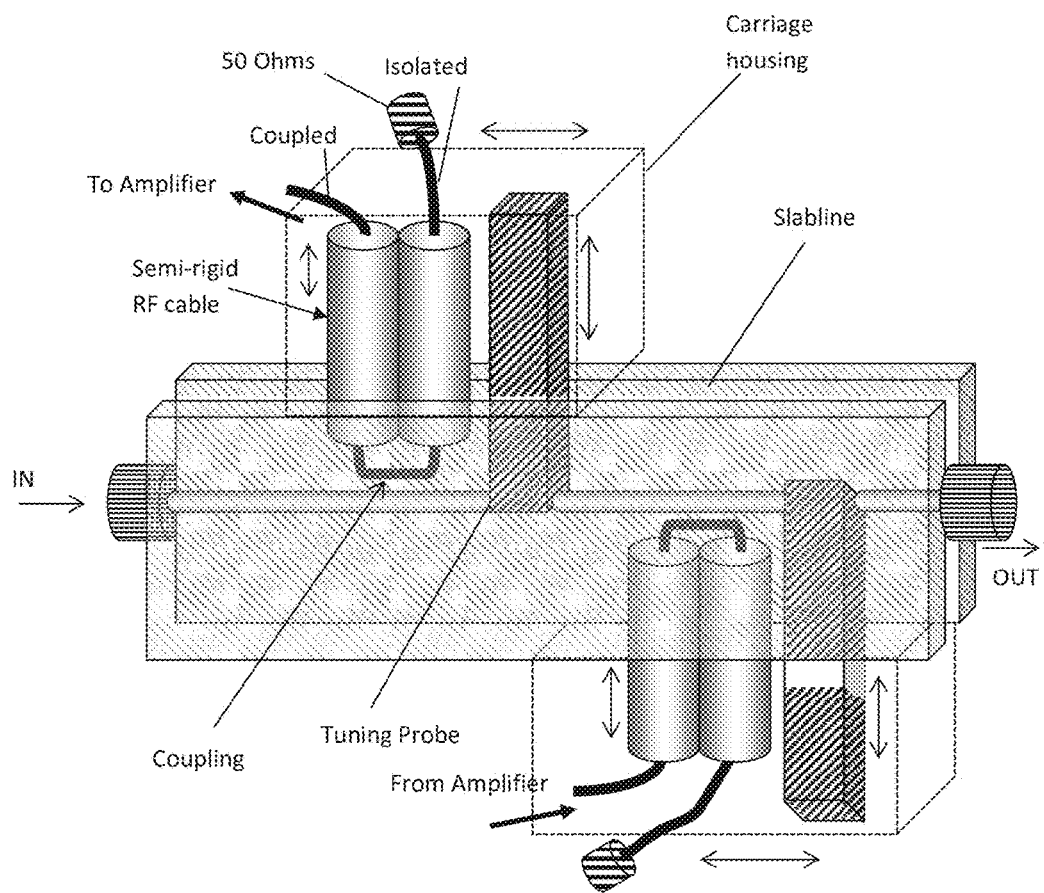
FIG. 10 depicts a perspective view of the hybrid harmonic tuner with the carriages, wave-probes and tuning probes mounted diametric on the slabline.
Figure 11A:
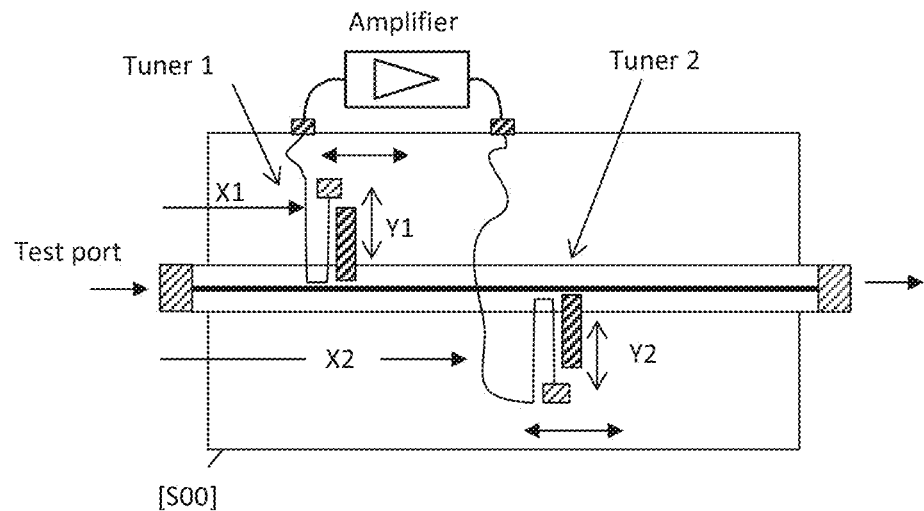
FIG. 11A through 11B depict two possible configurations of the diametric tuner operation.
Figure 11B:
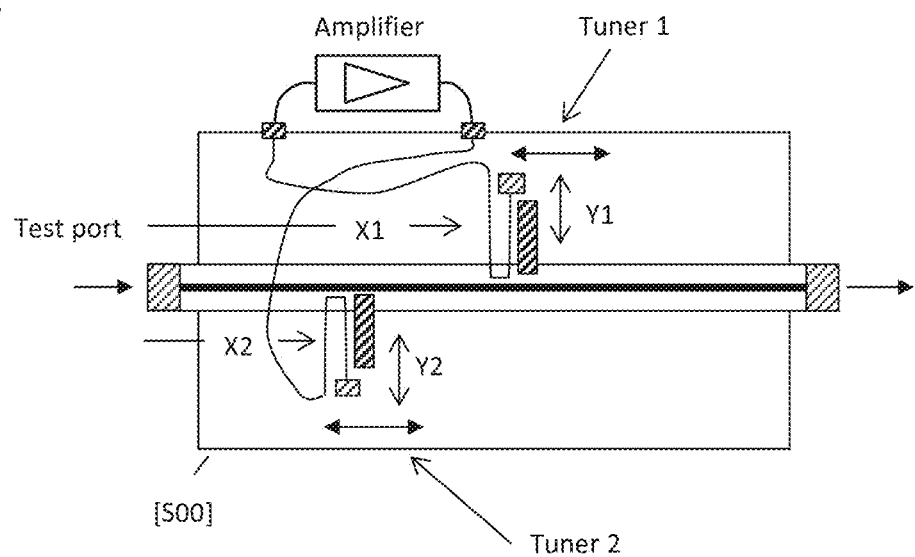

The tuner operates the same way as in the previous embodiment (FIG. 6); the two possible situations of the "double slabline" operation are shown in FIG. 11. In case of FIG. 11A, the first carriage (Tuner 1) is closer to the test port and the second carriage (Tuner 2) closer to the output (idle) port. The initialized scattering (s-) parameter matrix [S00] is shown to point to the tuner housing. The meaning of this symbolizes the fact that the matrix [S00] contains s-parameters of the tuner between the two ports (test and idle) when all wave-probes and tuning probes are fully withdrawn from the slabline. [S00] are, in fact, the s-parameters of the slabline itself, at all frequencies of interest (Fo, 2Fo, 3Fo . . . ). In case of FIG. 11B, the second carriage (Tuner 2) is closer to the test port and the first carriage to the idle port. In both cases the signal traversing the tuner is coupled by wave-probe 1, fed into the amplifier, amplified and fed back, through wave-probe 2 into the slabline, in direction of the test port. In all cases fed-though, reflected and transmitted signals are overlapping with controlled phases and amplitudes. It is a typical multi-reflection situation that can be handled only through appropriate calibration and numeric processing algorithms, interpolation and tuning methods, some of which will be disclosed further down. It is noticed that the de-embedding calibration technique, in which s-parameters are cascaded with the invers [S00] matrix: [TB]= [T00]$^{-1}$*[TA], whereby [TA] is the transfer matrix corresponding to [SA], [T00] transfer matrix to [S00], etc. This method is used to extract the multiple use of the slabline parameters from sequential calibration of wave-probes and tuning probes uses as a criterion the proximity of either probe (wave- or tuning-) to the test port. Only the s-parameters of the specific probe, in the specific horizontal position are kept intact, all others-parameters are de-embedded. This operation occurs in post-processing of the collected data in computer memory, where all the s-parameter permutations occur. This means, also, that, if the probes are mounted as shown in FIGS. 10 and 11, then s-parameters of tuning probes will always be de-embedded and only wave-probes-parameters will, alternatively, be de-embedded. It is obvious that wave-probe and tuning probe horizontal positions (WX and TX) track each-other, because their physical distance inside each carriage is constant: TX1=WX1+DX1, TX2=WX2+DX2, whereby DX=DX1 and DX=DX2 for each carriage correspondingly, FIG. 5.

Figure 7:
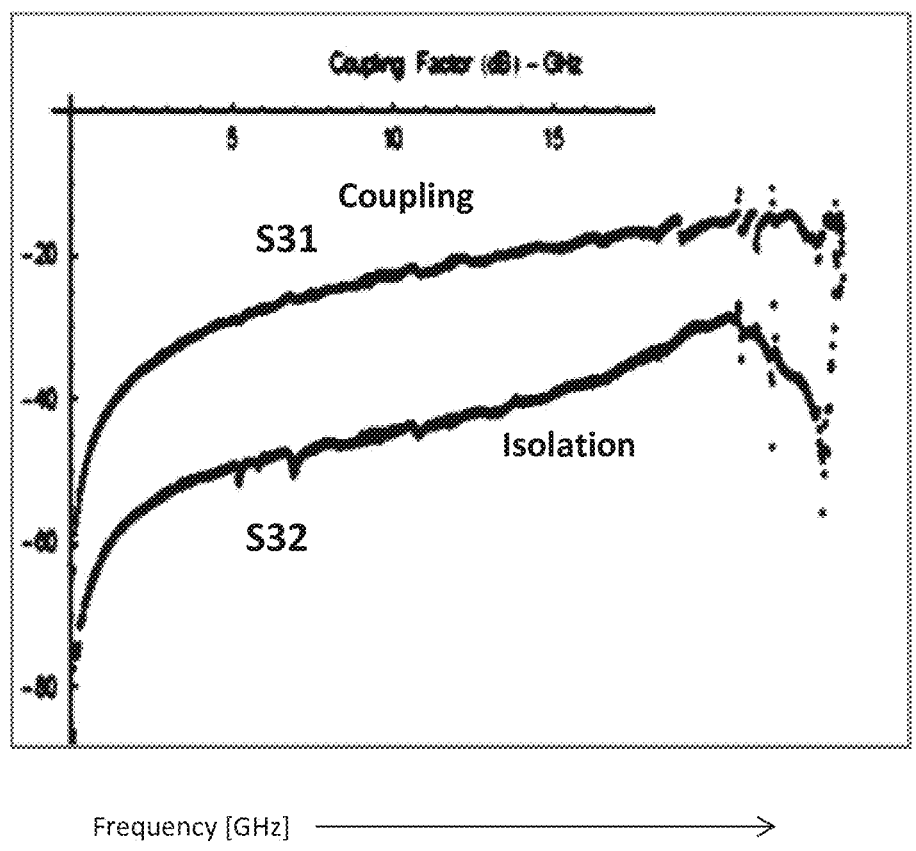
FIG. 7 depicts prior art, the dependence of coupling factor and isolation of wave-probes as a function of frequency.
Figure 8:
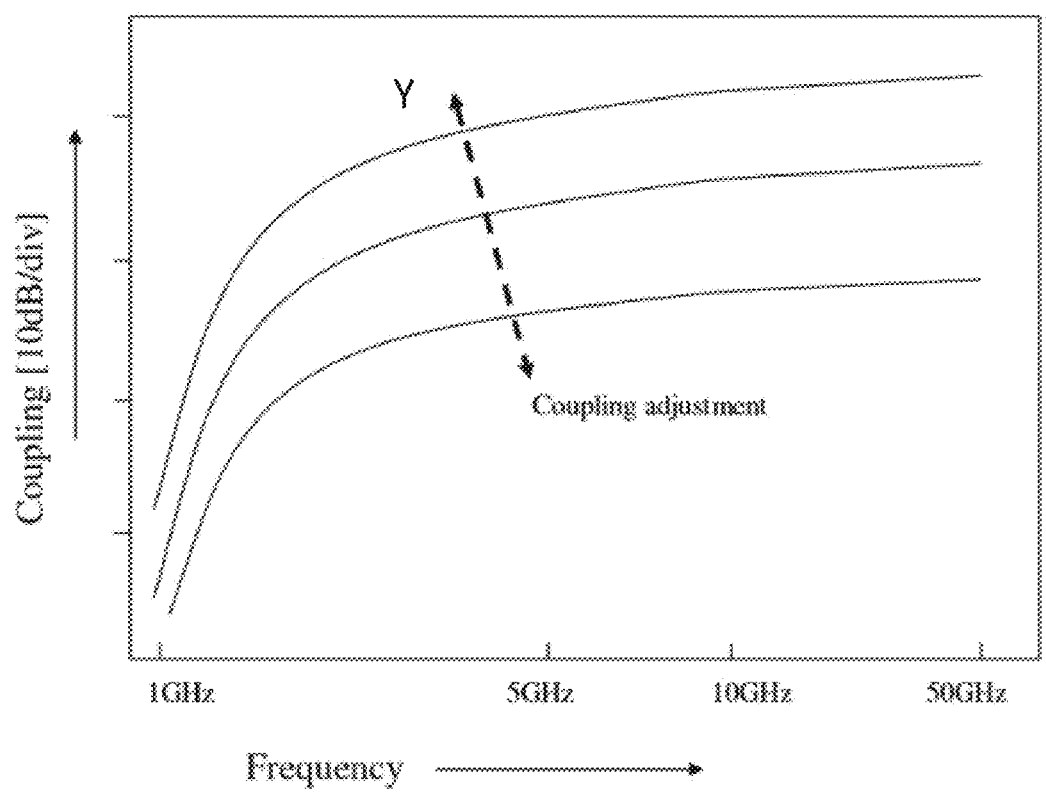
FIG. 8 depicts variation of coupling factor as a function of proximity of coupler loop to center conductor (probe penetration) and frequency.
Figure 9:
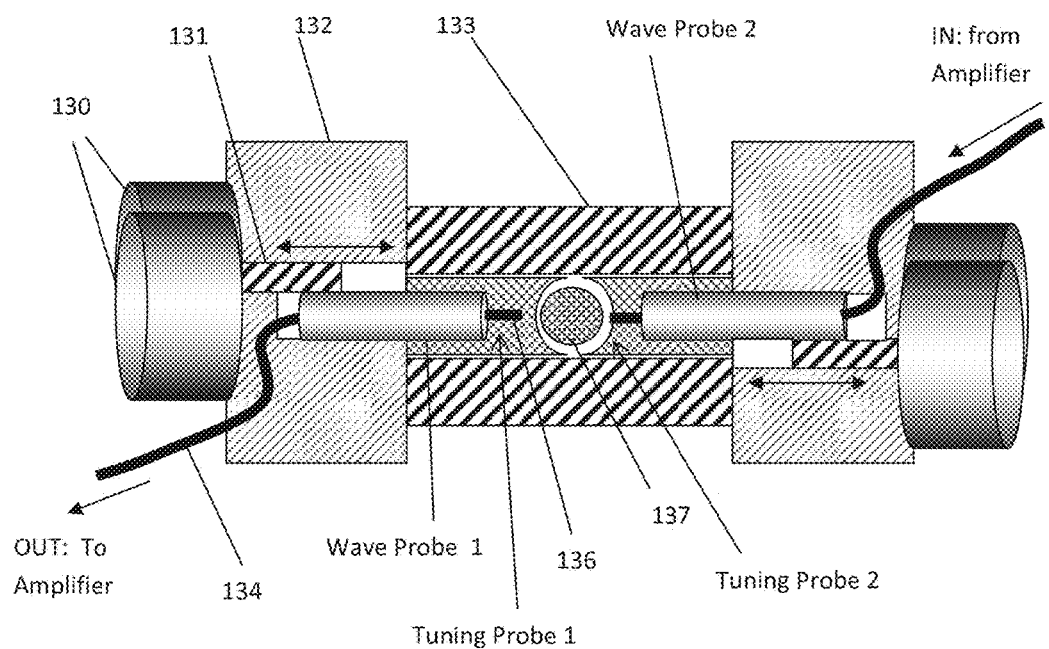
FIG. 9 depicts cross section of hybrid harmonic tuner whereby the carriages, wave-probes and tuning probes are mounted diametric (from opposite sides of the slabline) in order to reduce the required physical length of the slabline by a factor of 2.

The signal flow inside the hybrid tuner is represented, schematically, in FIG. 13. In the specification, to avoid misunderstandings, we use the < > bracket symbols to identify the power waves present in the system: <a> and <b>. In the drawings we use also the letters a and b alone if there is no possible misunderstanding. The word "schematically" is used here, because, in reality the situation is more complex, if one considers residual phenomena, like non-infinite isolation of the wave-probe branches (see FIG. 7, S31 (dB) minus S32 (dB)) and multiple back-and-forth reflections. The incoming signal power wave <b> is coupled first into wave-probe 1 (Tuner 1); the coupled quantity is <b*C1> whereby C1 is the coupling factor of wave-probe 1 (C<1). In FIG. 7, C1 corresponds to S31. This value is adjustable (FIG. 8); typical values used in this type of tuner for C1 are −10 to −15 dB (0.1 to 0.03). The coupled signal is injected into and retrieved from the amplifier, through flexible RF cables; the amplifier has a gain of G (typically 30 dB (=1000) or higher) and injected back into the slabline through the wave-probe 2; this portion amounts to <b*C1*G*C2>. The main signal <b> after being reduced by the amount coupled into wave-probe 1 is <b*(1−C1)>. This signal is reflected at the first tuning probe (Tuner 1) with the reflection factor $\Gamma_{t1}$ and is returned to the test port: <b*(1−C1)*$\Gamma_{t1}$>, where it overlaps with the incoming signal from wave-probe 2. The remaining signal amount <b*(1−C1)* (1−$\Gamma_{t1}$) is the again coupled backwards into wave-probe 2 losing part of its strength (C2) and finally reflected back at tuner probe 2 (Tuner 2): the returning signal, which will overlap again at the test port with the previously returned signals is: <b*(1−C1)*(1−C2)*(1−rt1)*rt2>.

The total returning signal power wave is $$<a>=<b>*\{G*C1*C2+(1-C1)*(1-C2)*(1-rt1)*\Gamma_{t2}+(1-C1)*\Gamma_{t1}\}>.$$

The total reflection at the DUT port is $$\Gamma_{load}=<a>/<b>=G*C1*C2+(1-C1)*(1-C2)*(1-\Gamma_{t1})*\Gamma_{t2}+(1-C1)*\Gamma_{t1}.$$

Figure 12:
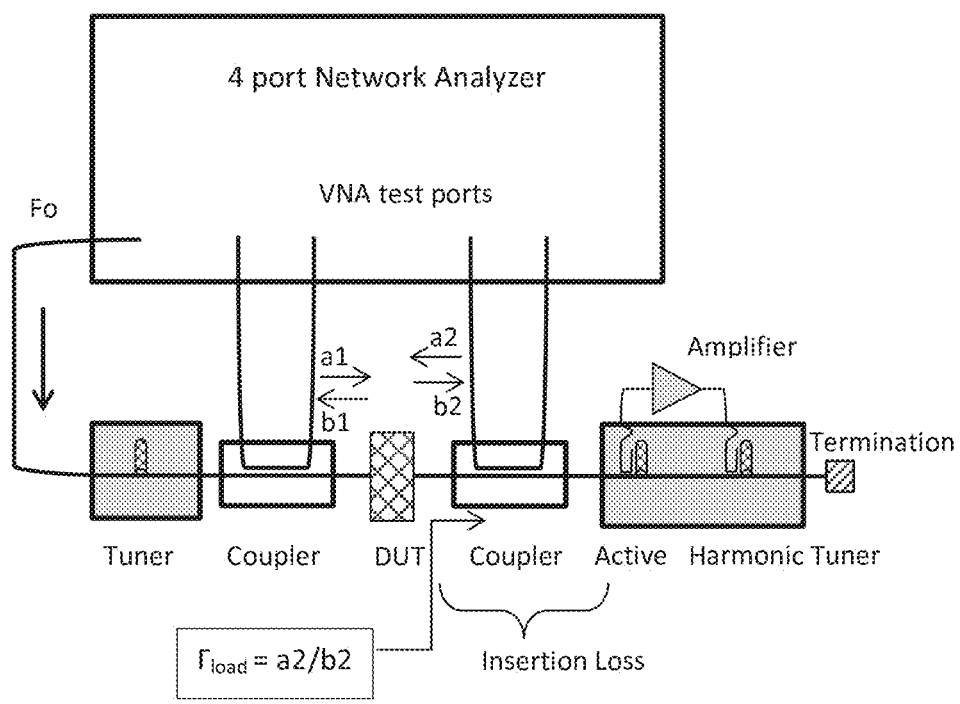
FIG. 12 depicts a load pull measurement setup using hybrid harmonic tuner and four-port VNA; the VNA is used to measure incident and extracted power waves <ai>, <bi> from the DUT at the fundamental and harmonic frequencies.

Depending on the actual value of C1, C2, G, $\Gamma_{t1}$ and $\Gamma_{t2}$ the magnitude of |$\Gamma_{load}$| can be equal or larger than 1. The objective to reach values >1 is required by the fact that connections between the DUT and the tuner introduce insertion loss, which reduces the reflection factor at the DUT reference plane and must be compensated (FIG. 12). Considering that all above coefficients are complex having a real and imaginary part and backwards travelling waves are re-reflected forward creating multiple reflections, it becomes obvious that such a situation cannot easily be handled analytically with equations. It can only be processed with actually measured calibration data numerically, in which case only the net values of the various signal vectors, including the relative amplitude and phases, as they arrive at the test port, after being coupled, amplified, injected and reflected, are taken into account.

Figure 14:
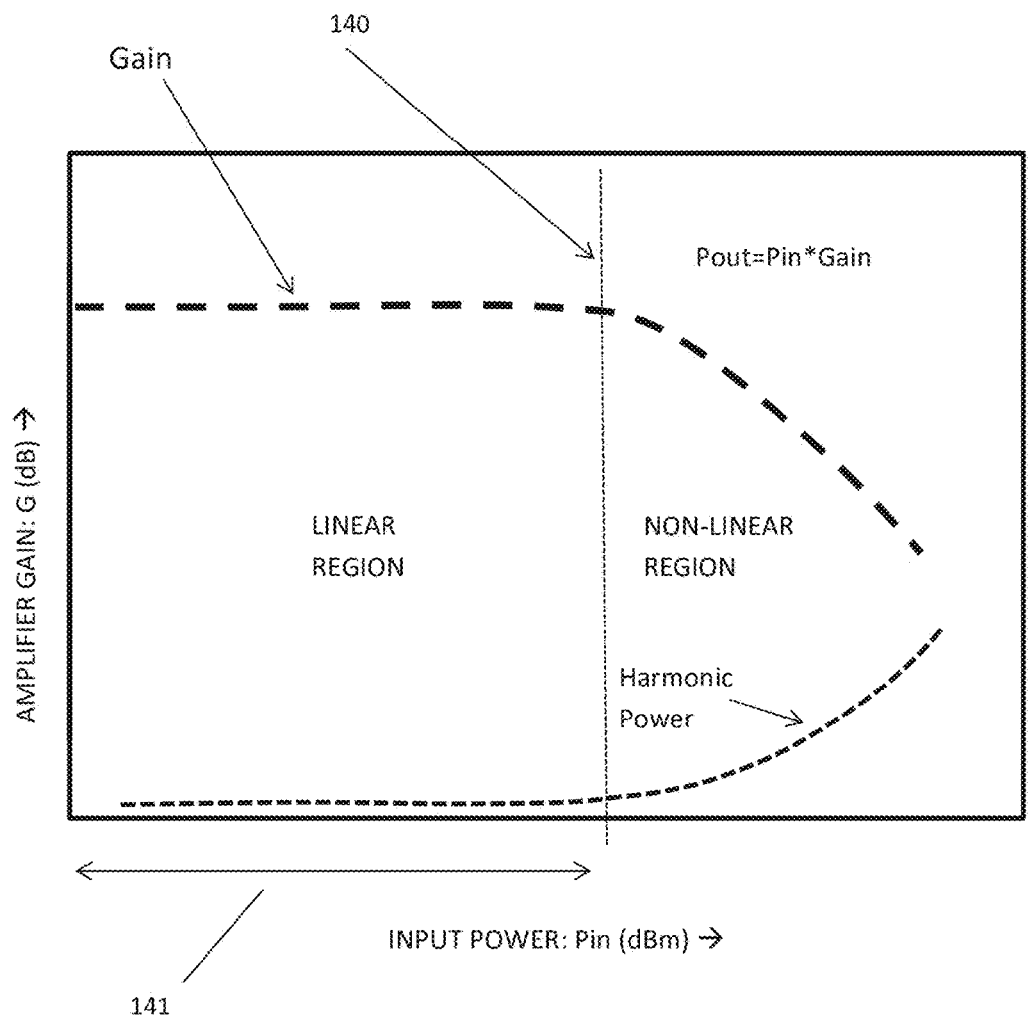
FIG. 14 depicts prior art, the linear and non-linear operation range of an amplifier including gain compression and harmonic power generation.

All active systems use amplifiers. Amplifiers are active components in which DC power is converted into RF power at a given frequency and with given efficiency. Efficiency is defined as output RF power (Pout) minus input RF power (Pin) divided by DC power (Pde), or Pout=G*Pin; Eff= (Pout−Pin)/Pdc=Pout*(1−1/G)/Pdc, whereby G is the Gain of the amplifier; The gain is also, typically, expressed in Decibel (dB): G(dB)=10*log$_{10}$ (G). For example: 0 dB=1; 10 dB=10; 20 dB=100 etc.; but in all equations used here all quantities (Power, Gain and coupling factors C1 and C2 are linear numbers, not Decibel). Amplifiers typically used in this application have gains of 30 dB (G=1000) in order to offer a reserve to compensate for signal loss due to the two coupling factors: G>1/(C1*C2). However output power is also very important, since the signal injected through wave-probe 2 must compare with the already existing signal in the slabline. In view of the fact that the output power available from the amplifier (Pout) is reduced by C2 before being injected, this shows that Pout is also very important; this puts constraints on the size of the amplifier in particular because, at increasing power it becomes "nonlinear" (FIG. 14). When the amplifier becomes nonlinear its gain drops dramatically. When the input power wave (in our case <b*C1>) exceeds a limit (140) the gain G drops and the operation may stop functioning as designed. In other words the system will allow predictable operation if the amplifier operates inside the linear region (141). The gain drop and operation change is not the only drawback; a nonlinear amplifier will create own harmonic signals which will mix with the originally injected signals included in power wave <b> coming from the DUT (which also contain harmonic components) and make things even less transparent. Never the less, the system proposed can handle moderate complications of this kind, if properly calibrated and operated in a test setup as shown in FIG. 12.

Figure 6:
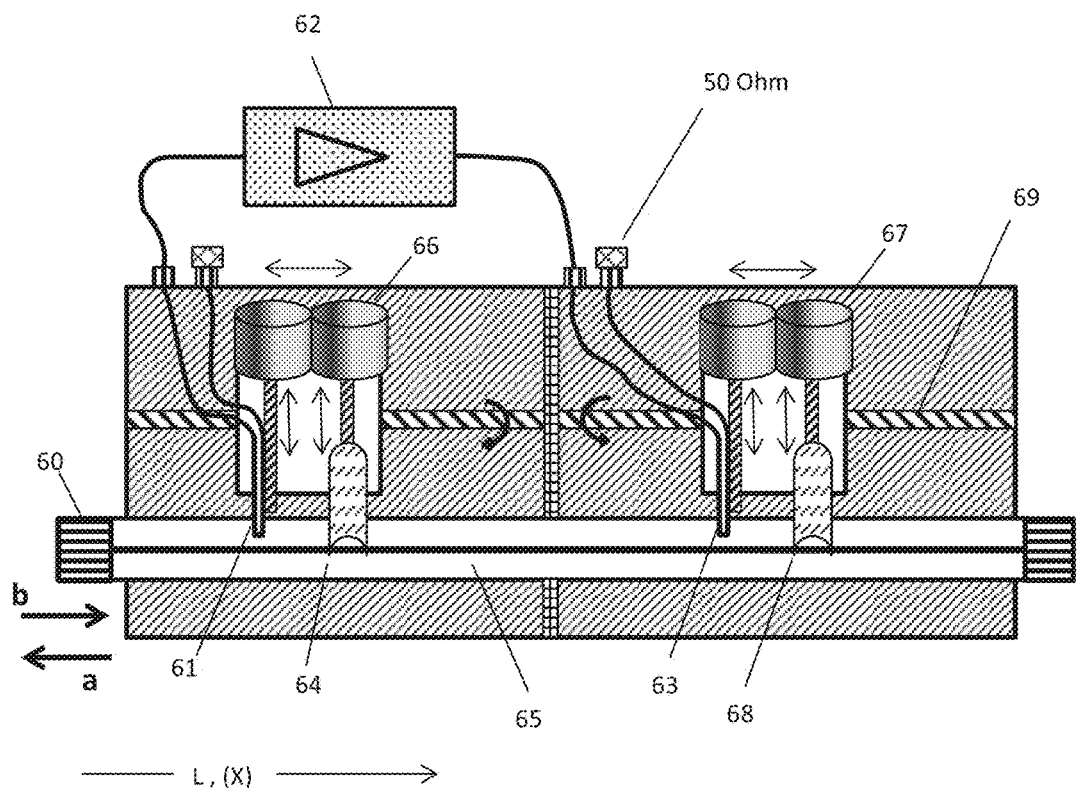
FIG. 6 depicts front view of hybrid harmonic tuner comprising two mobile carriages with wave-probe and tuning probe each and external power amplifier.

The tuner must be calibrated before being used. This is done in a test setup as in FIG. 15: a control computer is connected operationally with the pre-calibrated Vector Network Analyzer (VNA) and can control the tuner. The tuner is connected with the test ports of the VNA using flexible RF cables. The VNA measures the four s-parameters (S11, S12, S21, S22) of the tuner for a multitude of horizontal and vertical positions of the wave-probes and the tuning probes at all selected frequencies (typically a fundamental frequency Fo and one or two harmonic frequencies 2Fo and 3Fo). The probe positions are selected such that the tuning probes reflect from a minimum of $\Gamma_t<0.05$ and up to a maximum of $\Gamma_t=0.9$ and the wave-probes for coupling values between −10 dB and −40 dB. Horizontally the probes are moved at least one wavelength at the lowest frequency to cover 360 degrees on the reflection factor Smith chart. Since the probes are embedded in the same slabline (and housing) their individual behavior can only be assessed through a technique called "de-embedding". If this technique is not applied then each set of s-parameters will include the whole slabline as well. If s-parameters were then cascaded the slabline would appear in the fourth power. The de-embedding occurs by cascading s-parameters with the invers of the initialization matrix [S00]. [S00] is measured when all probes (tuning and wave-) are completely withdrawn from the slabline. In the configuration of FIG. 6 all s-parameters, except those for wave-probe 1 (61) are cascaded with [S00]$^{-1}$. In the configuration of FIGS. 10 and 11 only the s-parameters of the probe with the smallest horizontal coordinate (X) are left intact, and all others are d-embedded. As can be seen from FIG. 11 the carriages can change order: carriage 2 can be closer to the test port than carriage 1. In that case the de-embedding switches from wave-probe 2 to wave-probe 1. This operation is performed in computer memory during s-parameter matrix permutations.

In terms of procedure the steps to follow are:
a) All wave-probes and tuning probes are withdrawn from the slabline and the slabline is undisturbed; then s-parameters of the tuner (i.e. the slabline) are measured at all selected frequencies and saved in an initialization matrix [S00]=(S11.00,S12.00,S21.00,S22.00).
b) Wave-probe 1 is inserted into the slabline in a number of vertical steps WY1.j and for each WY1.j it is moved horizontally in a number of steps WX1.i.
c) S-parameters [S1(WX1.i,WY1.j)]={S1.11(WX1.i,WY1.j), S1.12(WX1.i,WY1.j)=S1.21(WX1.i,WY1.j), S2.22(WX1.i,WY1.j)}, are measured between the input and output ports and saved.
d) Wave-probe 1 is withdrawn and steps b) and c) are applied to wave-probe 2 resulting in a matrix [S2 (WX2.i,WY2.j)], defined following step c).
e) Both wave-probes are withdrawn from the slabline.
f) Tuning probe 1 is inserted into the slabline in a number of vertical steps TY1.j and for each TY1.j it is moved horizontally in a number of steps TX1.i.
g) S-parameters [S3(TX1.i,TY1.j)], defined following step c), are measured between the input and output ports and saved.
h) Tuning probe 1 is withdrawn and steps f) and g) are applied to tuning probe 2 resulting in a matrix [S4 (TX2.i,TY2.j)], defined following step c).
i) S-parameters of all probes (wave-probes and tuning probes) at all horizontal and vertical settings selected, except of the probe whose horizontal position (X) is closest to the test port, are de-embedded using matrix [Soor 1, i.e. their equivalent T-parameter version is multiplied with the invers of the [TOO] matrix, which is the T-parameter version of [S00].
j) Cascade (multiplication of the T versions of s-parameter) of all permutations of all s-parameter matrices, [S1] to [S4], are created in computer memory and saved in calibration files for all selected frequencies for later use.

After the generation of the cascaded permutations in computer memory, s-parameter calibration data for the tuner are available for all horizontal and vertical positions at all selected (fundamental and harmonic) frequencies.

As already discussed previously the linearity of the amplifier is critical for the validity of the calibration data and predictability of the system operation. If the amplifier is driven in non-linear regime the gain (G) changes and so do the s-parameters of the tuner, for constant horizontal and vertical probe positions. This inhibits tuning operations, which use calibration data. Therefore the appropriate test setup for this (and any other active) system is shown in FIG. 12; in this setup a four-port VNA is used and measures incident and reflected power waves (a1, a2, b1, b2) at the DUT input and output ports. This allows instantaneous calculation of input and output power as well as load reflection factor (impedance) rLoad=<a2>/<b2>. If the power generated by the DUT (<b2>) after being coupled into the wave-probe 1 (<b2>*C1) drives the amplifier into non-linear operation (FIG. 14) then tuning using calibrated data becomes imprecise and appropriate search routines need to be activated, using the actually tuned $\Gamma_{Load}$ instead of the calculated one. Alternatively this "interactive tuning" step can be omitted and the actually measured $\Gamma_{Load}$ is simply registered and saved, associated with the output power, efficiency or other parameter of interest, in the load pull data file. Evaluation is always possible in post processing the data using ISO contouring routines. In fact, even if the amplifier generates harmonic content itself, it still can be accounted for, since the actual $\Gamma_{Load}$ is measured at Fo, 2Fo, 3Fo . . . as well.

Discrete calibrated s-parameters are often not densely distributed enough to produce accurate tuning. In that case interpolated data can be used. There are several algorithms known that allow sufficiently accurate interpolation. In the specific situation the interpolation is carried through for each probe individually before cascading the data. The detailed interpolation method is outlined in a previous publication, used for single tuning probe tuners (see ref. 7).

The hybrid tuner generates user-defined target impedances (reflection factors) using previously collected calibration data, when the amplifier (62) operates in the linear region (FIG. 14), but also when the amplifier operates in the nonlinear region. The approach in both cases is slightly different. In any case, however, when an active component (amplifier) is part of the tuning system, an "in-situ" post-tuning verification is necessary; for this the test setup of FIG. 12 is always recommended. Whereas in the linear case the tuned reflection factor will be very close to the targeted value, in the non-linear case there will be deviations, which may require post-tuning iterations based on "measure-and-tune" steps. In general the tuning method for hybrid tuner uses calibration data in following steps:

a) Calibration data (s-parameters for the various probe settings) are loaded in computer memory for all selected frequencies Fo, 2Fo, 3Fo . . . .

b) An error function EF is generated which is the sum of vector differences between target reflection factor S11.T(F) and calibrated reflection factor S11.C(F): LIS11.T-S11.CI for all selected frequencies F=Fo, 2Fo, 3Fo . . . .

c) A numeric search algorithm through the whole s-parameter space selects the carriage and probe positions TX1, TX2 (or WX1, WX2) and vertical axis (probe) positions WY1, WY2, TY1, TY2 corresponding to minimum error function EF in step b).

d) The carriages and the vertical axes are positioned as in step c).

If interpolated data are used the number of possible permutations is very large. In that case the data are segmented according to the fundamental frequency reflection factor values and the subsequent search considers only data in this particular segment. Assuming the vertical movement of a wave probe comprises 20 steps, of a tuning probe 50 steps and the horizontal movement 360 steps (1 degree resolution at Fo) then the total number of s-parameter sets is 26,200 settings per carriage and frequency. The total number of permutations then 1 s $1,372.88*10^9$ for the two frequencies (Fo and 2Fo, or Fo and 3Fo etc.). If the whole s-parameter space is divided in typically 100 segments around target reflection factors, then the total search is through 13.73 million data points, which, if executed properly will take only a few seconds.

Obvious alternative embodiments are imaginable but shall not impede on the originality of the idea of using slabline based phase and amplitude adjustable signal coupling structure to create a hybrid harmonic load pull tuner.

What I claim as my invention is:

1. A hybrid harmonic impedance tuner comprising,
   two ports, an input (test) port and an output (idle) port, and a slotted airline (slabline) between the ports,
   at least two mobile carriages sliding independently along the axis of the slabline and having two independent vertically movable axes each,
   an external amplifier having an input and an output port, and characteristic impedance (Zo) terminations;
   whereby each carriage carries one signal coupler (wave-probe) on one axis and one reflective (tuning) probe on the other axis,
   and whereby carriage #1 carries wave-probe #1 and tuning probe #1 and carriage #2 carries wave-probe #2 and tuning probe #2;
   whereby carriage #1 and carriage #2 are travelling on cascaded sections of the slabline;
   and whereby the wave-probes and the tuning probes are insertable to adjustable depth into the slot of the slabline;
   and whereby a coupled port of one wave-probe is connected to the input port of the amplifier and the output port of the amplifier is connected to a coupled port of the other wave-probe and whereby an isolated port of the wave-probes is terminated with Zo.

2. A compact hybrid harmonic slide screw impedance tuner comprising,
   two ports, an input (test) port and an output (idle) port, and a slotted airline (slabline) between the ports, said slabline comprising two parallel vertical conductive walls and a center conductor between the ports;
   and at least two mobile carriages sliding independently along the axis of the slabline and having two independent vertically movable axes each,
   an external amplifier having an input and an output port, and characteristic impedance (Zo) terminations;
   whereby each carriage carries one signal coupler (wave-probe) on one axis and one reflective tuning probe on the other axis,
   and whereby carriage #1 carries wave-probe #1 and tuning probe #1 and carriage #2 carries wave-probe #2 and tuning probe #2;
   and whereby the carriages are mounted diametric on top and bottom of the slabline sharing the same section of the slabline,
   and whereby the wave-probes and the tuning probes are insertable to adjustable depth into the slot of the slabline from opposite directions;
   and whereby a coupled port of one wave-probe is connected to the input port of the amplifier and the output port of the amplifier is connected to a coupled port of the other wave-probe and whereby an isolated port of the wave-probes is terminated with Zo.

3. The tuner of claim 1 or 2, whereby the horizontal position of the carriages along the slabline and their vertical axes are remotely controlled using appropriate gear, electrical stepper motors, control electronics, processor and control software.

4. A calibration method, wherein the tuner of claim 3 is connected to a pre-calibrated vector network analyzer (VNA) using RF cables and to a control computer using digital cable; and scattering (s−) parameters are measured by the VNA between the input (test) port and the output (idle) port of the tuner at the fundamental frequency (Fo) and at least one harmonic frequency (2Fo, 3Fo, . . . ), for various settings of the wave-probes (horizontal position WX and vertical position WY) and the tuning probes (horizontal position TX and vertical position TY), the settings being controlled by the computer, which is in operative communication with the VNA, in following steps:

a) all wave-probes and tuning probes are withdrawn from the slabline and s-parameters of the tuner (slabline) are measured at all selected frequencies and saved in an initialization matrix [S00];

b) wave-probe #1 is inserted into the slabline in a number of vertical steps WY1.j and for each WY1.j it is moved horizontally in a number of steps WX1.i;

c) s-parameters [S1(WX1.i,WY1.j)] are measured between the input and output ports and saved;

d) wave-probe #1 is withdrawn and steps b) and c) are applied to wave-probe #2 resulting in a matrix [S2(WX2.i,WY2.j)];

e) both wave-probes are withdrawn;

f) tuning probe #1 is inserted into the slabline in a number of vertical steps TY1.j and for each TY1.j it is moved horizontally in a number of steps TX1.i;

g) s-parameters [S3(TX1.i,TY1.j)] are measured between the input and output ports and saved;

h) tuning probe #1 is withdrawn and steps f) and g) are applied to tuning probe #2 resulting in a matrix [S4 (TX2.i,TY2.j)];

i) s-parameters of all probes (wave-probes and tuning probes) at all horizontal and vertical settings, except of the probe whose horizontal position (X) is closest to the test port, are de-embedded using matrix $[S00]^{-1}$;

j) cascaded permutations of all s-parameter matrices, [S1] to [S4], are created in computer memory and saved in calibration files for all selected frequencies for later use.

5. A tuning method for the tuner uses calibration data generated in claim 4 as follows:

a) s-parameters are loaded in memory for selected frequencies Fo, 2Fo, 3Fo . . . ;

b) error function EF is generated comprising the sum of vector differences between target reflection factor S11.T(F) and calibrated reflection factor S11.C(F) for all selected frequencies F=Fo, 2Fo, 3Fo . . . ;

c) a search algorithm through the s-parameter space selects the carriage positions TX1, TX2 (or WX1, WX2) and vertical axis (probe) positions WY1, WY2, TY1, TY2 corresponding to minimum error function EF in step b);

d) carriages and vertical axes are positioned as in step c).

6. Interpolated reflection factors S11(F) at each frequency (F) are used in claim 5, instead of calibrated ones.

\* \* \* \* \*